United States Patent
Sieland et al.

(10) Patent No.: US 10,848,036 B2
(45) Date of Patent: Nov. 24, 2020

(54) COMMUNICATION INTERFACE AND METHOD FOR OPERATING A COMMUNICATION INTERFACE

(71) Applicant: Robert Bosch GmbH, Stuttgart (DE)

(72) Inventors: Dirk Sieland, Auenwald (DE); Horst Kleinknecht, Fichtenberg (DE); Sobin Chalakkal Francis, Bietigheim (IN); Vignesh Ramani, Tamil Nadu (IN)

(73) Assignee: Robert Bosch GmbH, Stuttgart (DE)

( * ) Notice: Subject to any disclaimer, the term of this patent is extended or adjusted under 35 U.S.C. 154(b) by 207 days.

(21) Appl. No.: 16/078,731

(22) PCT Filed: Jan. 27, 2017

(86) PCT No.: PCT/EP2017/051796
§ 371 (c)(1),
(2) Date: Aug. 22, 2018

(87) PCT Pub. No.: WO2017/144235
PCT Pub. Date: Aug. 31, 2017

(65) Prior Publication Data
US 2019/0058378 A1 Feb. 21, 2019

(30) Foreign Application Priority Data
Feb. 24, 2016 (DE) .......................... 10 2016 202 834

(51) Int. Cl.
*H03K 19/003* (2006.01)
*H03K 19/0175* (2006.01)
(Continued)

(52) U.S. Cl.
CPC ........... *H02K 11/35* (2016.01); *F01N 3/2066* (2013.01); *H02K 5/225* (2013.01); *H02K 11/40* (2016.01);
(Continued)

(58) Field of Classification Search
CPC ........ H02K 11/30; H02K 11/35; H02K 11/40; H03K 5/01; H03K 5/02; H03K 5/023;
(Continued)

(56) References Cited

U.S. PATENT DOCUMENTS 4,593,206 A 6/1986 Neidorff et al.
2015/0303859 A1* 10/2015 Yamada .................. H02P 5/74
318/51

FOREIGN PATENT DOCUMENTS

CN 102822930 A 12/2012
CN 105142984 A 12/2015
(Continued)

OTHER PUBLICATIONS

International Search Report for Application No. PCT/EP2017/051796 dated Apr. 26, 2017 (English Translation, 3 pages).

*Primary Examiner* — Diana J. Cheng
(74) *Attorney, Agent, or Firm* — Michael Best & Friedrich LLP

(57) ABSTRACT

The invention relates to a communication interface between a control unit and an electric load unit, particularly a load unit having a pump motor in a motor vehicle, wherein the control unit is designed as a transmitter and/or receiver, wherein the load unit is designed as a receiver and/or transmitter and wherein the communication between the transmitter and the receiver takes place via a signal line by means of a pulse-width-modulated signal. In this case, there is provision for the signal line to be connected to a constant current source and for the transmitter to be designed to modulate the flow of current through the signal line by means of pulse-width modulation. The invention further relates to a method for operating such a communication interface.

15 Claims, 3 Drawing Sheets

(51) Int. Cl.
*H03K 5/01* (2006.01)
*H02K 11/35* (2016.01)
*H04L 25/49* (2006.01)
*H02K 11/40* (2016.01)
*F01N 3/20* (2006.01)
*H02K 5/22* (2006.01)

(52) U.S. Cl.
CPC ......... *H03K 5/01* (2013.01); *H03K 19/00346* (2013.01); *H03K 19/01759* (2013.01); *H03K 19/017518* (2013.01); *H04L 25/4902* (2013.01)

(58) Field of Classification Search
CPC .... H03K 5/026; H03K 5/08; H03K 19/00346; H03K 19/00353; H03K 19/00361; H03K 19/0175; H03K 19/017509; H03K 19/017536; H03K 19/01759; H04L 25/38; H04L 25/40; H04L 25/49; H04L 25/4902
USPC .................................................. 327/108–112
See application file for complete search history.

(56) References Cited

FOREIGN PATENT DOCUMENTS

| | | | |
|---|---|---|---|
| DE | 4407991 | 9/1995 | |
| DE | 102008014045 | 9/2009 | |
| DE | 102014107689 | 12/2014 | |
| DE | 102013220418 | 4/2015 | |
| EP | 0481544 | 4/1992 | |
| EP | 2347932 | 7/2011 | |
| WO | WO-2015020317 A1 * | 2/2015 | ............ H02M 7/538 |

* cited by examiner

COMMUNICATION INTERFACE AND METHOD FOR OPERATING A COMMUNICATION INTERFACE

BACKGROUND OF THE INVENTION

The invention relates to a communication interface between a control unit and an electric load unit, particularly a load unit having a pump motor in a motor vehicle, wherein the control unit is designed as a transmitter and/or receiver, wherein the load unit is designed as a receiver and/or transmitter and wherein the communication between the transmitter and the receiver takes place via a signal line by means of a pulse-width-modulated signal.

The invention further relates to a method for operating such a communication interface.

For bidirectional data exchange between a control unit and a connected electrical load unit, it is known that provision is made for a control conductor, via which the data is exchanged by means of a pulse-width modulated signal. Thus it is known, for example, within a motor vehicle via pulse-width modulation to transmit data from an engine control device to a pump motor of an SCR system (SCR: Selective Catalytic Reduction) or in the opposite direction. The data can be, for example, control data for the load unit or diagnostic data for monitoring the load unit. In addition, methods are known for detecting faults on the supply lines of the load unit, for example, short-circuits or interruptions. For this purpose, a small measurement current may be fed into the control line and monitored. The measurement current is transferred unregulated via a suitable series resistor to the control line. By activation and deactivation of the pulse-width modulated measurement current, a data transfer is possible. It is also known to monitor the voltage level on the control line and from this to draw conclusions as to a possible short-circuit.

By feeding high currents due to other consumers into the earth system, it is possible for different ground potentials to exist between the control unit and the load unit. Furthermore, components that are used for switching the communication signals into the communication path, and/or into the measurement current path, produce an additional voltage offset. These components can be MOS-FET modules, for example in the form of dual p-channel FETs. Due to the ground offset, the evaluation of voltage signals for data transfer or for diagnosis may be corrupted. This leads to faulty diagnoses, as well as an error-prone data transfer.

A further disadvantage is that the measurement current is highly dependent on fluctuations of the supply voltage and of the ground potential, so that, for example at low supply voltages the required current is no longer achieved, while at high supply voltages the series resistor is heated excessively.

DE 10 2013 220 418 A1 discloses a method and a device for controlling components. The data exchange takes place via a pulse-width modulation of a technical variable, for example an electric current.

The document DE 10 2008 014 045 A1 discloses a circuit arrangement for controlling an electrical safety belt retractor. This involves the transmission of pulse-width modulated trigger signals. The data exchange can take place bi-directionally.

SUMMARY OF THE INVENTION

The object of the invention is to provide a communication interface between a transmitter and a receiver, which provides both a reliable data exchange and a reliable error monitoring even in the presence of large ground offsets between the transmitter and the receiver.

It is an additional object of the invention to provide a appropriate method for the above object.

The object of the invention relating to the communication interface is achieved by the fact that the signal line is connected to a constant current source and that the transmitter is designed to modulate the current flow through the signal line using pulse-width modulation. By using a constant current source, the current amplitude within the signal line is very nearly independent of a potential difference between the ground potentials of the transmitter and the receiver. The current flow is also independent of the supply voltage of the transmitter and the receiver over a wide range. This ensures that a current signal which can be readily evaluated is available both for the data transfer and for diagnostic purposes at all times. The pulse-width modulated current signal for data transfer can be measured directly on the receiver side.

In order to be able to send data both from the control unit (transmitter) to the load unit (receiver) as well as from the load unit (transmitter) to the control unit (receiver), it can be provided that the communication interface is designed to be bi-directional. As a result, it is possible that both data for controlling the load unit and, for example, operational data from the load unit to the control unit can be sent via one signal line.

The modulation of the pulse width of the current signal can be effected by the fact that the transmitter has a controllable electronic switch, which connects the signal line to a ground potential of the transmitter in accordance with the pulse-width modulation. When the electronic switch is closed, the current supplied by the constant current source flows from the signal line through the switch to the ground of the transmitter, and either no current or only a small current flows from the sender to the receiver. When the switch is open, on the other hand, the current of the constant current source flows to the receiver. In this way a pulse-width modulated current signal can be generated with a current amplitude which is independent of a ground offset between the transmitter and the receiver during the period of the open electronic switch.

Another resulting advantageous property is that, in the case of a bi-directionally designed communication interface, only one constant current source is required.

According to a preferred design variant of the invention, it can be provided that in the receiver, a current signal undergoes a transformation into a voltage signal, which is referenced to the ground potential of the receiver. Due to the use of the constant current, the voltage signal obtained is independent of a potential difference between the ground potential of the transmitter and the receiver and can be detected in an error-free manner.

As part of an on-board diagnostics of a motor vehicle, for example, it can be necessary to detect a load dropout, or a short circuit of the control line to ground. A suitable monitoring can be achieved by the fact that the constant current source is set up to supply energy to a ground potential and to the voltage potential of a voltage supply of the load unit, that the control unit is designed to determine the current flow in the signal line and that the control unit is designed to infer an interruption in the power supply or of an earth cable or of the signal line to the load unit if the current flow falls below a specified value. As a result of an interruption of the voltage supply or the ground connection to the load unit, the energy supply of the constant current source is also interrupted, which can be detected in the control unit. When the signal line is interrupted it is also the case that no current flow is possible from the constant current source to the control unit. Advantageously, the monitoring takes place during a diagnosis phase, in which no data are transferred over the signal line, with the electronic switches open. It is also possible to perform the monitoring during the PWM operation, in each case within the period of time in which the respective electronic switch is closed.

Also as part of an on-board diagnosis it can be provided that the control unit is designed to determine the current flow in the signal line and that the control unit is designed to infer a short circuit between the signal line and the ground potential if the current flow falls below a predefined value, and/or that the control unit is designed to infer a short circuit between the signal line and the voltage supply if the current flow exceeds a predefined value. As a result of the precisely defined current signals and/or voltage signals derived therefrom, referenced to the ground potential of the respective receiver, that are produced by the constant current in normal operation, any deviation in this can be easily and reliably detected. Any short circuits to the signal line can thus be detected unambiguously and without errors.

The electronic switch connects the signal line to ground. In order to prevent the electronic switch from being overloaded, for example, in the event of a short-circuit of the signal line to the supply voltage, provision can be made to limit the current flow through the controllable electronic switch.

The object of the invention relating to the method is achieved by the fact that the communication takes place by way of a pulse-width modulated current signal of a constant current source flowing through the signal line. The method thus enables the operation of the communication interface described. As a result of the constant current, which is pulse-width modulated for the purpose of data transmission, the method ensures a reliable and clearly evaluable data transfer independently of any ground offset existing between the transmitter and the receiver.

In order to enable a simple and reliable evaluation of the data signal on the receiver side, it can be provided that the current signal through the signal line is converted in the receiver into a voltage signal which is referenced to the ground potential of the receiver.

According to a preferred variant embodiment of the invention, it can be provided that for monitoring the communication interface, a constant current of the constant current source is coupled into the signal line, that the current in the control unit is determined, that an interruption of an electrical connection to the load unit or a short circuit between the signal line and a ground potential is inferred if the current falls below a predefined first threshold value and/or that a short circuit between the signal line and a voltage supply is inferred if the current exceeds a predetermined second threshold value. Faults in the cable connection between the control unit and the load unit can thus be unambiguously detected.

BRIEF DESCRIPTION OF THE DRAWINGS

The invention is explained below in more detail by reference to an exemplary embodiment shown in the figures. Shown are.

DETAILED DESCRIPTION

Figure 1:
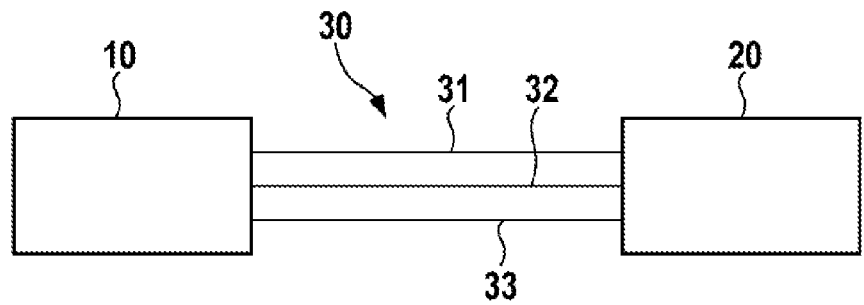
FIG. 1 a block diagram of a control unit and a load unit StdT in accordance with the prior art connected to the control unit via a cable connection, FIG. 2 a simplified representation of the control unit and load unit StdT shown in FIG. 1, FIG. 3 a communication interface for pulse-width modulated data transmission having a constant current source and FIG. 4 the communication interface shown in FIG. 3 with a constant current source that can be switched off.

FIG. 1 shows a block diagram of a control unit 10 and a load unit StdT 20 connected to the control unit 10 via a cable connection 30, such as are known from the prior art. A voltage supply 31 and a ground cable 32 are routed from the control unit 10 to the load unit StdT 20. In addition, a signal line 33 is provided between the control unit 10 and the load unit StdT 20. In the exemplary embodiment shown, the control unit 10 is assigned to a system for the selective catalytic reduction (SCR) of nitrogen oxides in a motor vehicle, while the load unit StdT 20 is represented by a pump with an associated pump electronics of the SCR system.

The signal line 33 is part of a bi-directionally designed communication interface between the control unit 10 and the load unit StdT 20. Via these components, data can be exchanged from the control unit 10 to the load unit StdT 20 as well as in the opposite direction, by means of a pulse-width modulated signal. Thus, for example, commands for setting the engine speed or for diagnostic requests can be transmitted from the control unit 10 to the pump. In the opposite direction, for example, the load unit StdT 20 can transmit data on the functional status of a pump motor, or measurement values of internal motor sensors.

Figure 2:
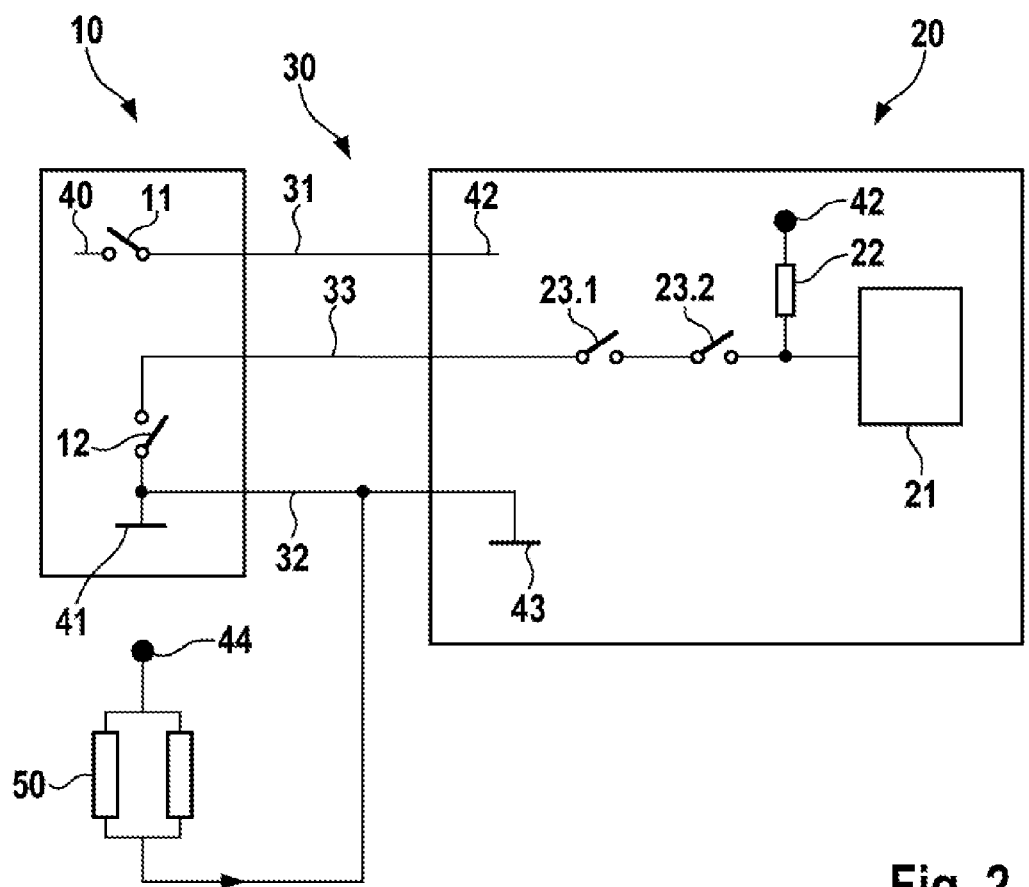

FIG. 2 shows a simplified representation of the control unit 10 and load unit StdT 20 shown in FIG. 1 in a design in accordance with the prior art. In this case, the control unit 10 and the load unit StdT 20 are connected to each other over the previously described cable connection 30.

The voltage supply 31 connects a voltage potential SE 40 of the control unit 10 to a voltage potential LE 42 of the load unit StdT 20 via a switch U B 11. Alternatively, the switch UB 11 can also be formed by a relay arranged outside of the control unit 10 and controlled by the control unit 10. Due to line and contact resistances, for example, the voltage potential SE 40 and the voltage potential LE 42 can be different. The signal line 33 is located in the control unit 10 via an electronic switch 12 at a ground potential ST 41 of the control unit 10. On the opposite side to the load unit StdT 20 the signal line 33 is connected via the electronic switches T104 23.1 and T104.1 23.2 to a microcontroller LE 21 of the load unit StdT 20. The electrical connection between the electronic switch T104.1 23.2 and the microcontroller LE 21 is connected via a resistor R110 22 to the voltage potential LE 42 of the load unit StdT 20. The ground cable 32 produces a connection between the ground potential SE 41 of the control unit 10 and the ground potential LE 43 of the load unit StdT 20. It is additionally connected to an electrical load 50, in this exemplary embodiment to a heater arranged in the SCR system, which is supplied with power on the opposite side via a voltage potential VB 44.

Via the resistor R110 22, a current of approx. 1 mA is fed into the signal line 33. With the aid of the electronic switch T104 23.1 and T104.1 23.2, the microcontroller LE 21 can switch the current in a pulse-width-modulated mode and thus transmit data from the load unit StdT 20 to the control unit 10. Furthermore, it is also possible that the microcontroller LE 21 operates the pulse width modulation independently and directly by means of its internal driver output stage, since in its design this driver output stage corresponds to an electronic switch, which in turn connects the signal to ground potential LE 43. Furthermore, with the aid of the electronic switches T104 23.1, T104.1 23.2 the connection to the control line 33 can be completely interrupted in the event of a fault.

Via the switch 12 in the control unit 10, the signal line 33 can be connected to the ground potential SE 41 and therefore be referenced to this. By means of a suitable pulse-width-modulated activation of the switch 12, data can thus be sent from the control unit 10 to the load unit StdT 20.

At the output of the control unit 10 to the signal line 33, short circuits to the supply voltage and to ground can be monitored, along with a dropout of the load unit StdT 20. For diagnostic purposes, the current flow fed into the signal line 33 via resistor R110 22 as well as the voltage level of the signal line 33 are evaluated. In the event of a load dropout, the current flow is interrupted and the fault is detected. If the voltage level with the electronic switch 12 closed is close to the supply voltage, a short circuit to the supply voltage is assumed to exist. If a voltage level close to ground is determined with the electronic switch 12 open, then a short circuit of the signal line 33 to ground is detected.

Both for the data exchange and for the diagnostic functions described above, a correct ground reference of the control unit 10 and the load unit StdT 20 is required. The presence of a high current of, for example, 20 A discharged to the ground system, in the present exemplary embodiment by the electrical load 50, can give rise to a ground offset, however, between the ground potential SE 41 of the control unit 10 and the ground potential LE 43 of the load unit StdT 20. The generation of current for the diagnostic function through the resistor R110 22 in the load unit StdT 20 is highly voltage-dependent. For small supply voltages, the required current amplitude of >1 mA can now barely be reached and at higher supply voltages the resistor R110 22 heats up very strongly.

An additional voltage offset may be caused by the two electronic switches T104 23.1, T104.1 23.2, which in the case of known circuits form a "back-to-back" configuration, which typically consists of two p-channel FET components. This switch configuration causes a high sensitivity to voltage offsets on the ground cable, since the MOS-FETs used in the p-channel variant themselves require an internal voltage offset to function correctly, and also pass on this voltage offset to the control unit 10 and the microcontroller LE 21 as a base offset. A Low-signal of 0V transmitted by the control unit 10 over the signal line 33 is increased by approximately 2V by the MOS-FET. If an additional voltage offset then occurs on the ground cable 32 between the control unit 10 and the load unit StdT 20, for example due to the electrical load 50, the diagnostic function in the control unit 10 can no longer reliably detect the diagnostic request, which can lead to diagnosis errors. Similarly, errors in the communication from the control unit 10 to the load unit StdT 20 can be caused by the voltage offset.

Figure 3:
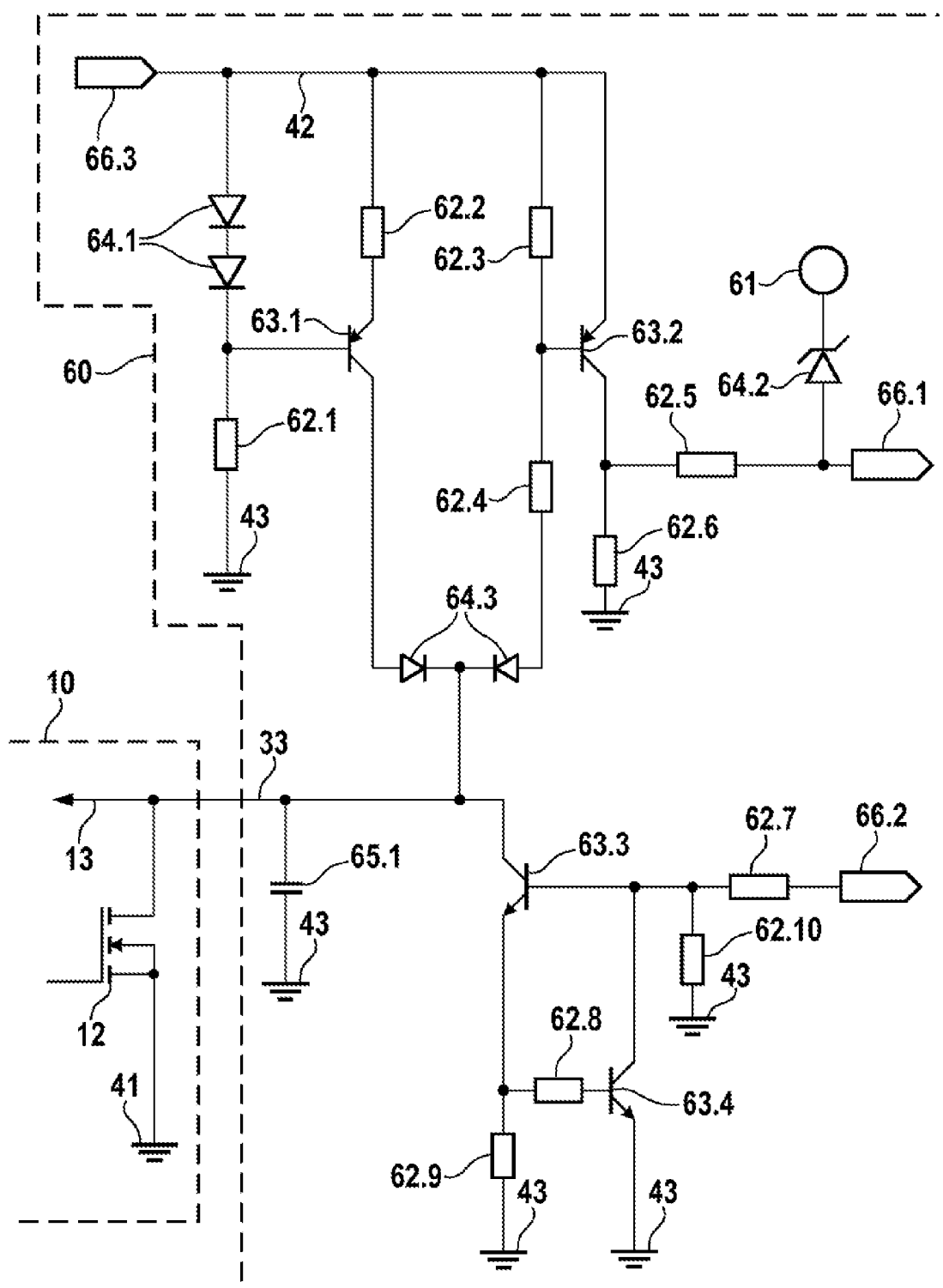

FIG. 3 shows a communication interface according to the invention for pulse-width modulated data transmission with a constant current source.

Of the cable connection 30 shown in FIGS. 1 and 2 between the control unit 10 and a load unit 60 only the signal line 33 is shown, to simplify the illustration. It is connected in the control unit 10 via the electronic switch 12 to the ground potential SE 41 of the control unit 10 and via a connection 13 to a microprocessor of the control unit 10.

The load unit 60 in the exemplary embodiment shown represents a pump in an SCR system. The constant current source is formed from the diodes D303 64.1, the resistors R314 62.1, R312 62.2 and the transistor T304A 63.1. The transistor T304A 63.1 in this case is connected via the double diode D305 64.3 to the signal line 33. To provide a power supply, the voltage potential LE 42 of the load unit 60 is fed to the constant current source via the terminal UB 66.3. The components of the constant current source are dimensioned in such a way that it feeds a constant current of approx. 2 mA into the signal line 33. In the communication from the control unit 10 towards the load unit 60 the control unit 10 connects the signal line 33 via the electronic switch 12 to the ground potential SE 41 in accordance with the desired pulse-width modulated signal, for example with a carrier frequency of 100 Hz, on which the information is coded via the pulse-width modulation (duty cycle). As a result, with the electronic switch 12 closed, the current of the constant current source is discharged to the ground potential SE 41, resulting in a Low level in the signal line 33. If the electronic switch 12 is open, a high-level is present accordingly. The components R313 62.3, R316 62.4, and T304B 63.2, R317 62.6 and R315 62.5 convert the current flowing in the signal line 33 into a voltage level. The transistor T304B 63.2 is used for level matching, or level decoupling, between the signal line 33 and the input level of the microcontroller (not shown) of the load unit 60, which is connected to the port PWM IN 66.1. The microcontroller thus receives the data sent by the control unit 10. The diode D304 64.2 is connected to the supply voltage MC 61 of the microcontroller. It limits the converted voltage level to the signal voltage of 5 V typical for microprocessors. This will prevent damage to the input of the microprocessor. It is advantageous that information is no longer transmitted with a voltage reference, but with a current reference, since the electronic switch 12 of the control unit 10 is coupled to a ground potential, which activates the transistor T304B 63.2. From this, the resistors R317 62.6 and R315 62.5 then form a voltage level referenced to the ground potential LE 43 for the input of the microcontroller. Via this circuit a decoupling, which is less sensitive to potential voltage offsets on the earth cable, is thus produced between the control unit 10 and the microcontroller. The double diode D305 64.3 is used for coupling the constant current into the signal line 33 and for outputting the communication data from the signal line 33. Therefore, the signals are linked to each other, but decoupled from each other. The communication interface according to the invention thus enables the information to be transmitted from the control unit 10 in the direction of the microcontroller of the load unit 60 without being affected by ground-referenced voltage offsets.

The communication from the load unit 60 to the control unit 10 takes place via the electronic switch T306A 63.3 implemented as a transistor and the transistor T306B 63.4, acting together with the resistors R323 62.9 and R321 62.8. The resistors R320 62.7 and R322 62.10 are used to provide a clean control of the electronic switch T306A 63.3 via the output of the microcontroller (not shown) of the load unit 60 at a terminal PWM OUT 66.2. Upon activation of the electronic switch T306A 63.3 via the terminal PWM OUT 66.2, this discharges the constant current of the communication interface to the internal ground (ground potential LE 43) of the load unit 60. In this case, the output stage of the connected control unit 10 detects the absence of the current required for the diagnosis. In addition, the amplifier detects a Low level, since the load unit 60 does not discharge the diagnostic current to ground, but also pulls the entire signal line 33 down to ground potential. This is detected and evaluated by the control unit 10. In this way, to activate this function the load unit 60 can transmit an agreed set of information to the control unit 10 in advance. By means of a pulse-width-modulated activation of the electronic switch T306A 63.3, data can now be transmitted from the load unit 60 to the control unit 10. The data transmission therefore also takes place in this transmission direction by means of a suitable pulse-width modulation of the current of the constant current source, which makes the data transmission independent of a voltage offset between the ground potential LE 43 of the load unit and the ground potential SE 41 of the control unit 10.

A capacitor C315 65.1 connected between the signal line 33 and the ground potential LE 43 of the load unit 60 serves to reduce the EMC emissions, as well as to improve the susceptibility of the communication line to EMC radiation. It also serves to improve the signal quality.

As part of an on-board diagnosis, for example, a load dropout of the voltage supply 31 and ground cable 32 shown in FIGS. 1 and 2, and a short-circuit from ground and/or the supply voltage to the signal line 33 must be reliably detectable. If an interruption of the supply voltage 31 or of the earth cable 32 occurs, the constant current source no longer supplies the set constant current of approximately 2 mA. This can also be reliably detected by the control unit 10 in the case of a high voltage offset between the ground potential SE 41 of the control unit 10 and the ground potential LE 43 of the load unit 60. If an interruption occurs in the voltage supply 31, the double diode D305 64.3 prevents a diagnosis current flowing from the control unit 10 via the signal line 33 into the circuit part of the constant current source and into the circuit part for level decoupling of the current flowing in the signal line 33 into a voltage level for the micro controller, not shown, of the load unit 60. The electronic switch T306A 63.3, which is in the blocking direction, prevents the diagnostic current from flowing away in the direction of the ground potential LE 43 of the load unit 60. In the event of an interruption in the ground cable 32, the circuit part allows a current flow of approximately 0.5 mA through the resistors R313 62.3, R316 62.4. This is sufficiently low that the control unit 10 unambiguously detects the load dropout.

If a short circuit of the signal line 33 with respect to the voltage supply 31 occurs, then two different error conditions can occur. In a first error condition, the electronic switch T306A 63.3 is turned on, because the load unit 60 would like to send a diagnostic message. This would result in a current increase through the electrical path of the electronic switch T306A 63.3, which in turn causes an increased voltage drop across the resistor R323 62.9. As a result, the transistor T306B 63.4 is activated more strongly, and so the electronic switch T306A 63.3 in turn regulates more strongly. As a result, the current is limited automatically. As a result of this measure, any component damage is avoided in the event of a short-circuit in the signal line 33 to the voltage supply 31. In a second error condition, the electronic switch T306A 63.3 is turned off, because the load unit 60 does not now wish to send a diagnostic message. In this error condition, there are no paths vulnerable to overcurrent that must be protected.

If a short circuit occurs in the signal line 33 to ground, then the current flow into the signal line 33 is limited by the constant current source, in this exemplary embodiment to approximately 2 mA. Therefore, damage to components is prevented here also. It is immaterial whether the load unit 60 is now sending a diagnostic message through the electronic switch T306A 63.3 or not.

The circuit shown in FIG. 3 therefore has a sending transistor (electronic switch T306A 63.3), which is current limiting in the diagnostic path and in the communication path. The constant current source and the receiving part of the load unit 60 are decoupled via the double diode D305 64.3. In the receive path of the load unit 60 a level conversion takes place. This is converted from a current-referenced communication into a voltage-referenced communications. The dependency on ground offsets therefore no longer applies.

Figure 4:
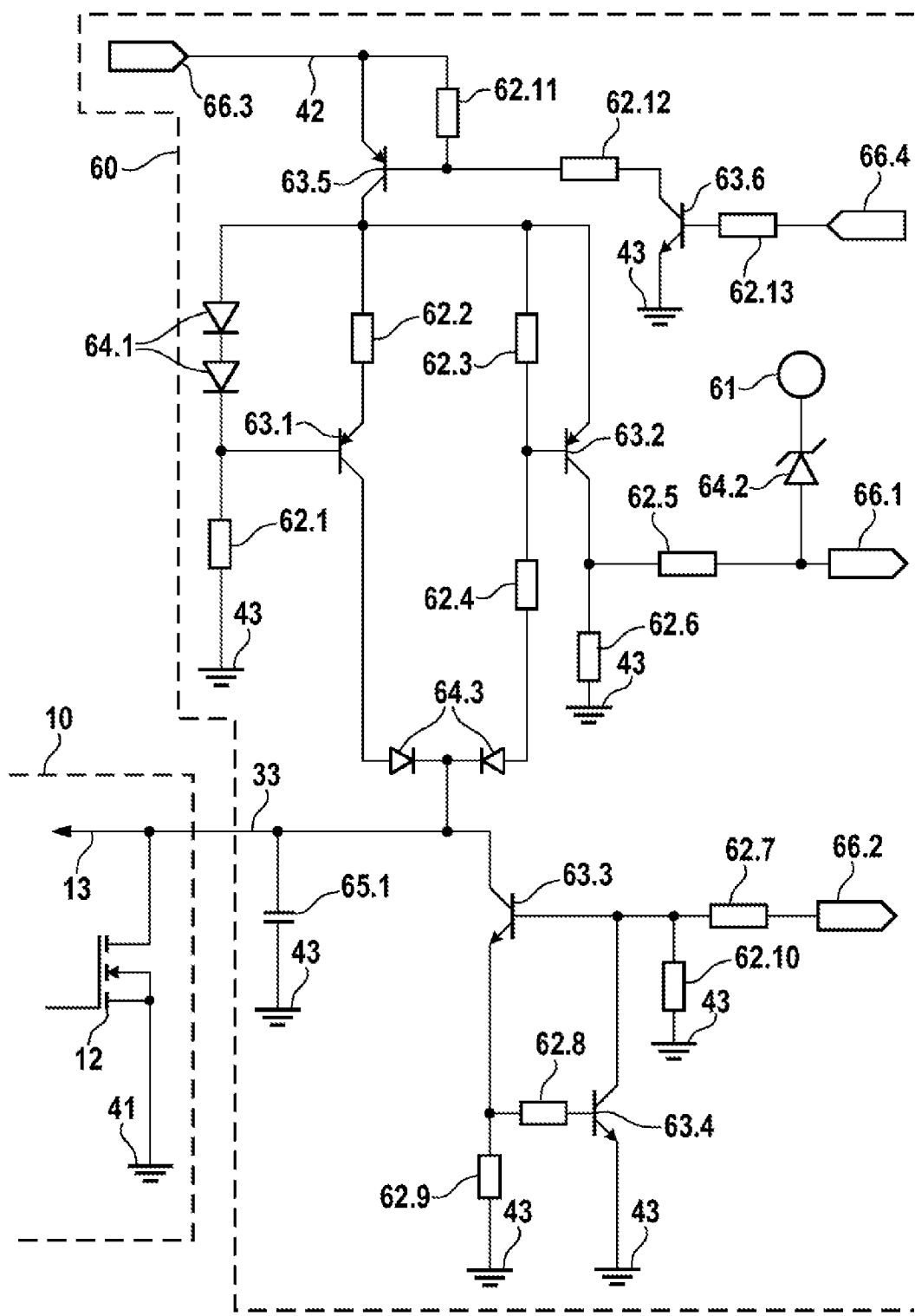

FIG. 4 shows the communication interface shown in FIG. 3 with a constant current source that can be switched off. Identical components are labelled in the same way. For the additional function the components T219 63.5, R296 62.11, R297 62.12 and T221A 63.6 are added. The transistor T221A 63.6 is connected through a resistor R298 62.13 via a terminal OAG_EN 66.4 to the microcontroller, not shown, of the load unit 60. The constant current source can thus be switched on and off via the transistor stage that is formed. In the event of a fault due to the interruption of the ground cable 32, this additional circuit blocks the residual current, which without it would continue to flow into the interface circuit, as described in relation to FIG. 3. Only when the supply voltage on the load unit is high enough that the microcontroller starts up and applies a logical High level at the base of transistor T221A 63.6 is the current source circuitry and the input circuit of the load unit 60 enabled. Otherwise, the current which could still be fed in via the supply path is blocked by the blocking path of the transistor T219 63.5. In this way a load dropout is reliably detected by the control unit 10.

The invention claimed is:

1. A communication interface between a control unit (10) and an electric load unit (60), wherein the control unit (10) is designed as a transmitter and/or receiver, wherein the load unit (60) is designed as a receiver and/or transmitter, the communication interface comprising:
   a signal line (33) between the control unit (10) and the electric load unit (60);
   a controllable electronic switch (12, 63.3) electrically coupled to the signal line (33) and positioned within the control unit (10); and
   a constant current source electrically coupled to the signal line (33) and positioned within the electric load unit (60),
wherein the communication between the control unit (10) and the electric load unit (60) takes place via the signal line (33) using a pulse-width-modulated signal, and
   wherein the signal line (33) is configured to modulate a current signal sourced from the constant current source through the signal line (33) and the controllable electronic switch (12, 63.3) to a ground potential (41, 43) by connecting the signal line (33) to the ground potential (41, 43) via the controllable electronic switch (12, 63.3).

2. The communication interface as claimed in claim 1, wherein the communication interface is designed to be bi-directional.

3. The communication interface as claimed in claim 1, wherein in the receiver, a transformation of the current signal into a voltage signal referenced to the ground potential (41, 43) of the receiver is provided.

4. The communication interface as claimed in claim 1, wherein the constant current source is set up to supply energy to the ground potential (41, 43) and to the voltage potential (40, 42) of a voltage supply (31) of the load unit (60), that the control unit (10) is configured to determine the current flow in the signal line (33) and that the control unit (10) is configured to infer an interruption in the voltage supply (31) or of an earth cable (32) or of the signal line (33) to the load unit (60) if the current flow drops below a specified value.

5. The communication interface as claimed in claim 1, wherein at the control unit (10) is configured to determine the current flow in the signal line (33) and that the control unit (10) is configured to infer a short circuit between the signal line (33) and the ground potential (41, 43) if the current flow falls below a predefined value and that the control unit (10) is configured to infer a short circuit between the signal line (33) and the voltage supply (31) if the current flow exceeds a predefined value.

6. The communication interface as claimed in claim 1, wherein the current flow through the controllable electronic switch is limited.

7. The communication interface as claimed in claim 1, wherein the electric load unit (60), is a load unit (60) having a pump motor in a motor vehicle.

8. The communication interface as claimed in claim 1, wherein the control unit (10) is configured to determine the current flow in the signal line (33) and that the control unit (10) is configured to infer a short circuit between the signal line (33) and the ground potential (41, 43) if the current flow falls below a predefined value.

9. The communication interface as claimed in claim 1, wherein the control unit (10) is configured to determine the current flow in the signal line (33) and that the control unit (10) is configured to infer a short circuit between the signal line (33) and the voltage supply (31) if the current flow exceeds a predefined value.

10. A method for operating a communication interface between a control unit (10) and an electric load unit (60), wherein the control unit (10) is designed as a transmitter and/or receiver, wherein the load unit (60) is designed as a receiver and/or transmitter and wherein the communication interface includes a signal line (33) between the control unit (10) and the electric load unit (33), a controllable electronic switch (12, 63.3) electrically coupled to the signal line (33) and positioned within the control unit (10), and a constant current source electrically coupled to the signal line (33) and positioned within the electric load unit (60), and wherein communication between the control unit (10) and the electric load unit (60) takes place via the signal line modulating a current signal sourced from a constant current source through the signal line (33) and the controllable electronic switch (12, 63.3) to a ground potential (41, 43) by connecting the signal line (33) to the ground potential (41, 43) via the controllable electronic switch (12, 63.3).

11. The method as claimed in claim 10, wherein the current signal through the signal line (33) is converted in the receiver into a voltage signal referenced to the ground potential (41, 43) of the receiver.

12. The method as claimed in claim 10, wherein for monitoring the communications interface a constant current of the constant current source is coupled into the signal line (33), that the current in the control unit (10) is determined, that an interruption of an electrical connection to the load unit (60) or a short circuit between the signal line (33) and the ground potential (41, 43) is inferred if the current falls below a predefined first threshold value and that a short circuit between the signal line (33) and a voltage supply (31) is inferred if the current exceeds a predetermined second threshold value.

13. The method as claimed in claim 10, wherein the electric load unit (60), is a load unit (60) having a pump motor in a motor vehicle.

14. The method as claimed in claim 10, wherein for monitoring the communications interface a constant current of the constant current source is coupled into the signal line (33), that the current in the control unit (10) is determined, that an interruption of an electrical connection to the load unit (60) or a short circuit between the signal line (33) and a ground potential (41, 43) is inferred if the current falls below a predefined first threshold value.

15. The method as claimed in claim 10, wherein for monitoring the communications interface a constant current of the constant current source is coupled into the signal line (33), that the current in the control unit (10) is determined, that an interruption of an electrical connection to the load unit (60) or a short circuit between the signal line (33) and a ground potential (41, 43) is inferred if the current exceeds a predetermined second threshold value.

* * * * *